United States Patent
Cordes et al.

(10) Patent No.: US 8,551,816 B2
(45) Date of Patent: Oct. 8, 2013

(54) DIRECT EDGE CONNECTION FOR MULTI-CHIP INTEGRATED CIRCUITS

(75) Inventors: Steven A. Cordes, Yorktown Heights, NY (US); Matthew J. Farinelli, New York, NY (US); Sherif A. Goma, Hawthorne, NY (US); Peter A. Gruber, Mohegan Lake, NY (US); John U. Knickerbocker, Monroe, NY (US); James L. Speidell, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 13/439,198

(22) Filed: Apr. 4, 2012

(65) Prior Publication Data

US 2012/0187577 A1    Jul. 26, 2012

Related U.S. Application Data

(63) Continuation of application No. 11/765,055, filed on Jun. 19, 2007, now Pat. No. 8,237,271.

(51) Int. Cl.
*H01L 21/44* (2006.01)
*H01L 23/48* (2006.01)

(52) U.S. Cl.
USPC ........... 438/109; 438/128; 438/613; 257/686; 257/777; 257/737; 257/780; 257/723; 257/E23.085

(58) Field of Classification Search
USPC ................ 438/108, 128, 109, 613; 257/734, 257/737, 686, 723, 777, 780, E23.085
See application file for complete search history.

(56) References Cited

U.S. PATENT DOCUMENTS

| | | | |
|---|---|---|---|
| 4,956,694 A * | 9/1990 | Eide ............................... | 257/686 |
| 5,016,138 A * | 5/1991 | Woodman ...................... | 361/688 |
| 5,397,916 A * | 3/1995 | Normington .................. | 257/686 |
| 6,720,206 B2 | 4/2004 | Choi | |
| 7,608,919 B1 | 10/2009 | Bernstein et al. | |
| 7,612,443 B1 * | 11/2009 | Bernstein et al. ............. | 257/685 |
| 8,237,271 B2 * | 8/2012 | Cordes et al. .................. | 257/737 |
| 2004/0043535 A1 * | 3/2004 | Jeung et al. .................... | 438/109 |
| 2006/0027728 A1 * | 2/2006 | Akram ............................ | 249/78 |
| 2006/0060954 A1 | 3/2006 | Meyer-Berg | |
| 2008/0237891 A1 | 10/2008 | Irsigler et al. | |

OTHER PUBLICATIONS

Bernstein, G., "System for Inter-Chip 1. Communication", U.S. Appl. No. 60/499,885, filed Sep. 4, 2003.

* cited by examiner

*Primary Examiner* — Nitin Parekh
(74) *Attorney, Agent, or Firm* — Louis J. Percello; Ryan, Mason & Lewis, LLP

(57) ABSTRACT

The present invention allows for direct chip-to-chip connections using the shortest possible signal path.

6 Claims, 9 Drawing Sheets

DIRECT EDGE CONNECTION FOR MULTI-CHIP INTEGRATED CIRCUITS

CROSS-REFERENCE TO RELATED APPLICATIONS

This application is a continuation of U.S. patent application Ser. No. 11/765,055, filed Jun. 19, 2007, incorporated by reference herein.

FIELD OF THE INVENTION

The present invention relates generally to interconnects and more particularly to multi-dimensional chip-to-chip interconnects.

BACKGROUND OF THE INVENTION

The amount of silicon "real estate" available for designers of integrated circuits (IC's) acts to limit the number of functional units (transistors, CPU's, memory, etc.) that may be fitted on any given IC. The amount of functionality can be increased by providing shorter transistor gate lengths, however, achievable device densities, as well as signal transmission speeds can be increased only so far, as the state of technology limits gate minimum length to only about 45 nm. The amount of functionality can also be increased by layering chips or dies one on top of another during front-end of the line (FEOL) processing, or by packaging and connecting multiple chips or dies via interposer chips into one discrete unit.

In the layered-device approach, for example as described in U.S. Pat. No. 6,821,826, multiple devices may be built up to a first metal level (FEOL) and then, through a series of wafer bonding processes, the devices may be layered. These aforementioned processes require many complex processing steps. Accurate thermal modeling of the resultant layered structure is very difficult to achieve. For example, it is unknown if heat generated at a lowest layer be adequately removed by a chip package.

Referring to FIG. 1, there is seen an example of one prior art chip-to-chip interconnect solution. In FIG. 1, a first chip 101 is connected to a second chip 103 by an intermediate interposer 102 that includes vias and/or ball solder connections. This method increases IC functionality at a packaging level by packaging multiple devices in close proximity to one another. The advantages of combining multiple types of IC's into one chip are well understood. Exemplary patents include, but are not limited to, U.S. Pat. No. 5,977,640, U.S. Pat. No. 5,362,986, U.S. Pat. No. 5,397,747, U.S. Pat. No. 6,414,374, U.S. Pat. No. 6,507,109, U.S. Pat. No. 6,800,505, and U.S. Pat. No. 6,828,173. Many of these patents address the technical solutions needed to stack or place multiple chips. These solutions require the fabrication of custom interposer chips to route signals from one chip to another. If needed, signals may be routed externally through a wirebond or specially made thin film wiring, however, this adds to the complexity and cost of fabricating such prior art "superchip" modules, and because signals have to travel through long interposers, solder, wirebond, and/or other connections, they can become degraded by the associated line resistance and parasitic capacitance.

The present invention addresses these as well as other deficiencies of the prior art.

SUMMARY OF THE INVENTION

The present invention, improves upon the prior art by providing robust multi-dimensional low contact-resistance chip-to-chip interconnections. Edge pads provided along one or more sides or edges of a substrate enables higher density, shorter distance, and/or more reliable electrical connections to be made to the substrate.

One or more embodiments of the invention provide direct electrical connection from the perimeter of one chip directly to a second chip. Chips may be fabricated with contacts that utilize deep etched trenches or blind vias that are filled with conductive material for example, solders such as C4, C4 high melt, Pb-free, etc. A separation process results in the formation of contacts on sidewalls of the chips such that these chips may not only have bond pads on their surfaces for topside connection (e.g. flip-chip or wirebonding), but also edge side wall connections that can allow chips to be directly connected in a side-to-side fashion. Direct edge connection enables the creation of minimized signal path that may be used to reduce signal loss and increase signal integrity and quality. In one embodiment, etched trenches provide a planar surface which allows additional pads to be connected to a carrier substrate using conventional connection techniques. In one embodiment, the present invention also enables vertical and horizontal chip stacking techniques, such as may be used for memory stacking and the like.

Processes for device separation and edge contact exposure include, but are not limited to, laser dicing, reactive ion etching, and anisotropic silicon etching, such as the use of XeF gas.

In the case of solder as the conductive material, sidewall contacts can be exposed and reflowed to provide a solder bump shape. Chips with edge contacts can be placed on an inexpensive carrier module and brought back up to the reflow temperature. At this point, surface tension forces may be used to allow the solder contacts to wet one another and "pull" the chips into close proximity. Various arrangements of the solder bumps on the carrier module can be used for alignment and positioning purposes.

Embodiments of the present invention may be used to allow for direct chip-to-chip connections using the shortest possible signal path, which may reduce signal loss. Embodiments of the present invention may be used to allow for capacitive coupling (non-contact) of signal pads, which may enable, for example, high speed (>10 Gbits/s) data transmission. Embodiments of the present invention may be used to allow chips to be stacked perpendicular to the surface of a carrier thus allowing for dense chip packing in a very small volume.

In one embodiment, a semiconductor device comprises a top; a bottom; and at least one side, wherein the top and the bottom and the at least one side comprise at least three generally planar surfaces, wherein the device comprises at least one cavity extending over at least two of the three generally planar surfaces, wherein within the at least one cavity there is disposed conductive material, wherein the conductive material comprises an outer surface. In one embodiment, at least some of the outer surface of the conductive material is generally coplanar with at least one of the three generally planar surfaces. In one embodiment, at least some of the outer surface of the conductive material extends past at least one of the three generally planar surfaces. In one embodiment, the at least one cavity comprises a depth that extends at least 10 um below at least one of the three generally planar surfaces. In one embodiment, the at least one cavity is an etched cavity. In one embodiment, the semiconductor device further comprises a carrier substrate, wherein the carrier substrate comprises at least one carrier pad, wherein the carrier pad is electrically coupled to the at least one conductive pad. In one embodiment, the semiconductor device comprises a carrier substrate, wherein the carrier substrate comprises at least one conductive pad, wherein the conductive pad is electrically coupled to the conductive material. In one embodiment, the at least one conductive pad comprises a flip chip pad. In one embodiment, on the semiconductor device there are formed one or more other devices, wherein the one or more devices are electrically coupled to the conductive material. In one embodiment, the conductive pads on the carrier substrate and the conductive material are coupled via a solder or solder like material.

In one embodiment, a semiconductor device comprises a plurality of substrates, each substrate having a top and a bottom and at least one side, wherein the top and the bottom and the at least one side respectively comprise three generally planar surfaces, wherein each substrate has formed therein on at least two of the three generally planar surfaces at least one cavity, wherein within the at least one cavity there is disposed conductive material, wherein the conductive material is formed to comprise an outer surface, and wherein an outer surface of at least some of the conductive material on one substrate is coupled to at least some of the conductive material on a second substrate. In one embodiment, the plurality of substrates are disposed relative to each other in a generally coplanar relationship. In one embodiment, the plurality of substrates comprises at least four substrates. In one embodiment, the outer surface of the conductive material extends past at least one of the three generally planar surfaces. In one embodiment, each substrate further comprises at least one substrate conductive pad. In one embodiment, the at least one substrate conductive pad comprises a flip chip pad. In one embodiment, the device further comprises a carrier substrate, wherein the carrier substrate comprises at least one carrier conductive pad, wherein at least one substrate conductive pad is coupled to at least one carrier conductive pad. In one embodiment, at least some of the conductive material is electrically coupled to at least one carrier conductive pad.

In one embodiment, at least two semiconductor devices comprise die interconnection means for electrically coupling of the at least two semiconductor devices to each other. In one embodiment, the die interconnection means comprises cavities that extend over at least two surfaces of the die, wherein the cavities are filled with a conductive material.

Other features, aspects, benefits, advantages, and embodiments are also within the scope of the present invention, and will be better understood with reference to the Description, Drawings, and Claims that follow.

DESCRIPTION

Figure 1:
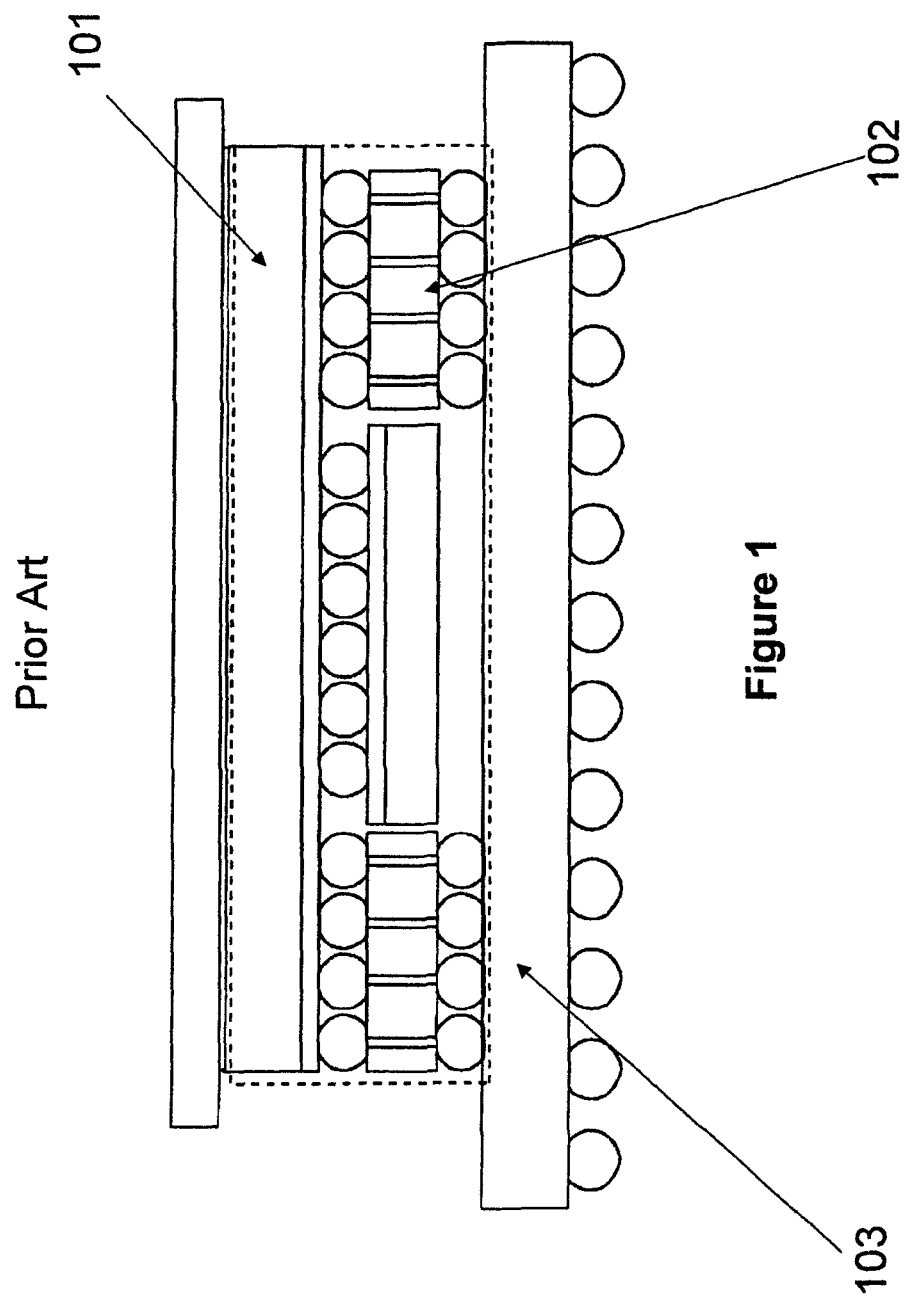
In FIG. 1 there is seen an example of one prior art chip-to-chip interconnect solution.
Figure 2:
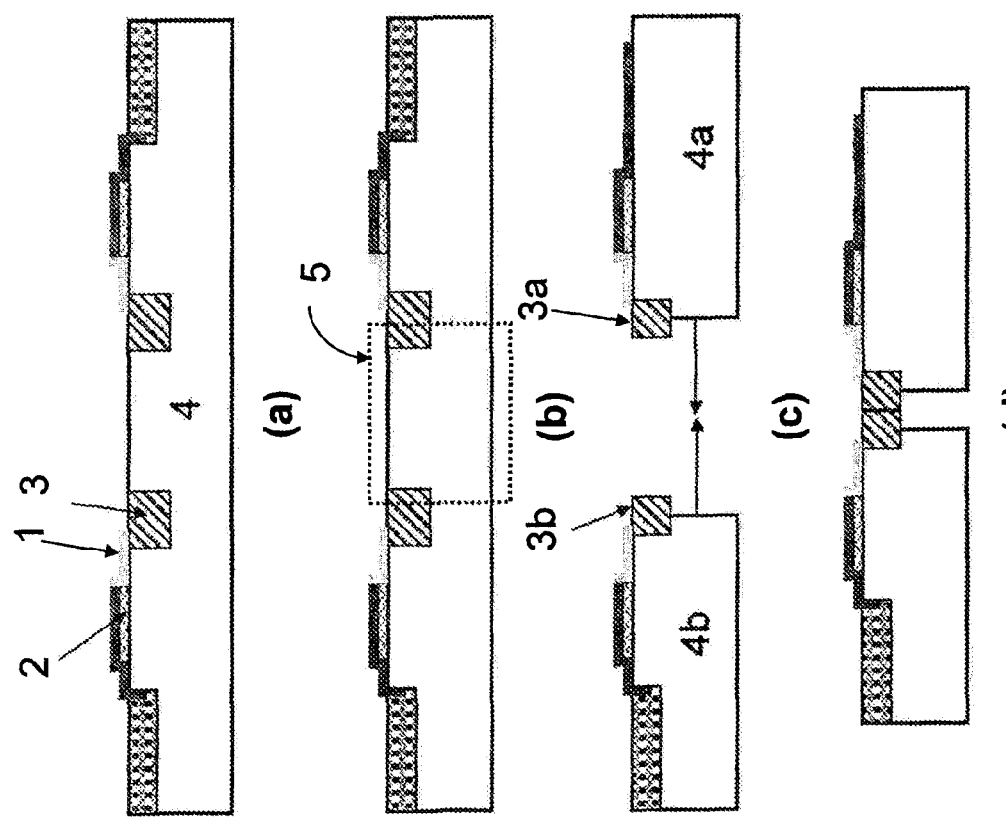
In FIGS. 2a-d there are seen representations of embodiments of the present invention.
Figure 3:
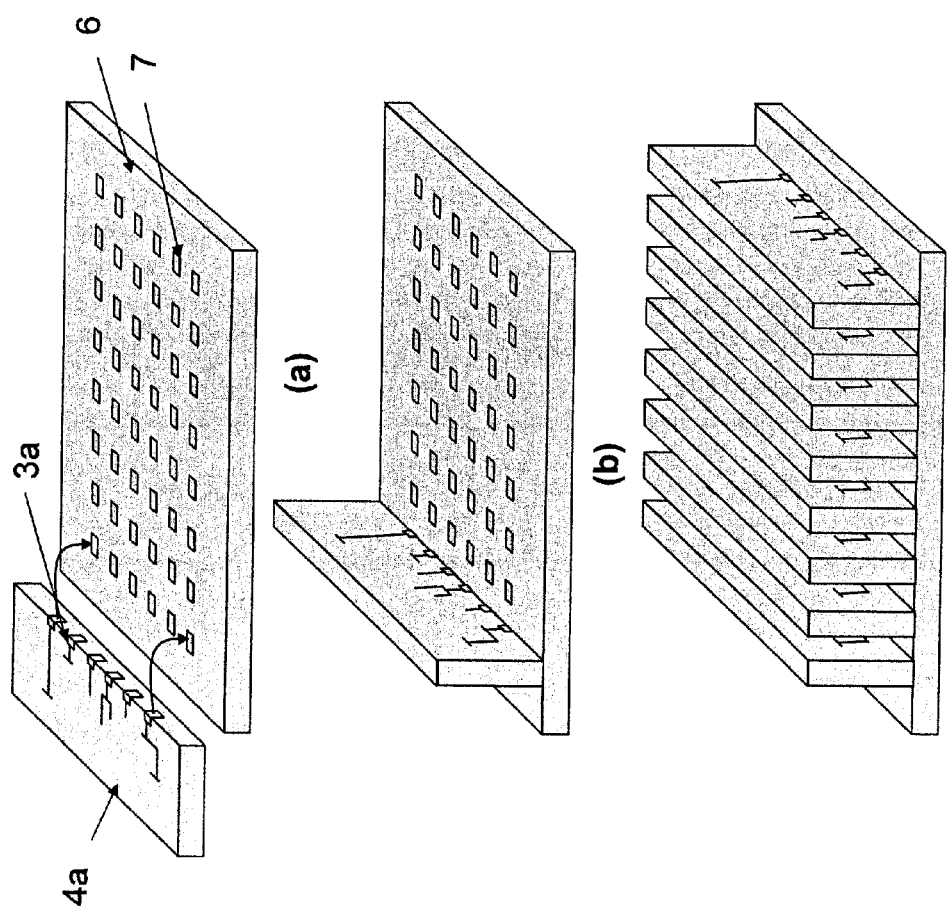
In FIGS. 3a-c there are seen representations of embodiments of the present invention during various formation steps.

The embodiments of the present invention that are disclosed herein should be understood to be limited only by the claims that follow. Further, various terms and phrases used herein are not intended to be limiting; but rather, to provide an understandable description of the invention that could be implemented by those skilled in the art. The drawings are in simplified form, may not be to scale, and may omit certain apparatus elements and method steps, and/or may include other elements or method steps that are not shown. For clarity, directional terms, such as top, bottom, left, right, up, down, over, above, below, beneath, rear, and front may be used with respect to the accompanying drawings, and these and similar directional terms should not be construed to limit the scope of the invention in any manner. The term "coupled", or similar terms as used herein, is defined as connected, although not necessarily directly, and not necessarily mechanically or electrically. The term "substrate" as used herein encompasses a broad category of devices that may be formed during semiconductor manufacture (for example, wafer, die, chip, substrate, and the like). In the description of embodiments that follow, details are presented generally. Therefore, specific structural and functional details disclosed herein should be interpreted a representative basis for teaching one skilled in the art how to variously implement both preferred and exemplary embodiments of the present invention without undue experimentation.

With reference to FIGS. 2-9 that follow, first a general description of these Figures is provided below, and then a more particular description with reference to each FIG. 2-9 is provided. In FIGS. 2-9, one or more edge pads 3a-b are disclosed to enable direct chip-to-chip interconnection to be made. In one embodiment, edge pads 3a-b are formed within cavities 3 of a substrate 4 by techniques known by those skilled in the art, for example, by deep reactive ion etching (DRIE) or wet etching. Cavities 3 may comprise a range of depths, for example 10-100 um deep. As needed for a particular application, lesser and greater cavity depths are also understood to be possible. In some embodiments, cavities 3 may be filled with a conductive material, and/or a bonding material, for example, solder or conductive epoxy. The filling technique used may depend on the material and the application, but can include injection molding of solder, plating, screen printing, or even plasma vapor deposition techniques. After formation of cavities 3 and edge pads 3a-b, substrate 4 may be separated into individual substrates 4a-b to expose edge pads 3a-b along edges of the substrates 4a-b.

Individual substrates 4a-b may be formed using a variety of techniques. In one embodiment, a substrate 4 may be diced using a conventional dicing saw blade. The blade may be used to cut through the substrate and cavities 3 in a manner that exposes surfaces of the edge pads 3a-b along the cut. This last technique may be subject to challenges such as chipping, cracking, smearing and pullout. To minimize these effects, the blade can be brought close to the edge of the resultant edge pads 3a-b, but not touch them.

In another embodiment, an etching process may be used on substrate 4 material. Techniques that can be used for this process include wet etching techniques, reactive ion etching techniques, or exposure to gases such as xenon fluoride.

In another embodiment, edge pads 3a-b may be exposed along sides of substrates 4a-b by employing the DRIE technique used to etch the cavities 3, for example, by defining etch channels in a DRIE mask. This last technique, if applied from the rear of a bottom of a substrate 4, may be used to have the edge pads 3*a-b* protrude from the sides of the substrates 4*a-b*.

Once separated, individual substrates 4*a-b* can be aligned to other individual substrates 4*a-b*, and corresponding edge pads 3*a-b* of the substrates may be positioned opposite each other and joined together. Different edge pads 3*a-b* can be the same material or different material, for example solder-solder, solder-metal, conductive adhesive-metal.

In one embodiment, edge pads 3*a-b* may be formed as conductive adhesive pads that have surfaces that are coplanar with sides of the substrates 4*a-b*. In one embodiment, one or more substrates 4*a-b* may be turned vertically on edge and aligned with surface pads formed on an orthogonally positioned carrier substrate 6. This last method enables die, chips, substrates, etc. to be packed on edge in close proximity on the surface of a carrier substrate. As needed, carrier substrate 6 may comprise interconnect wiring and/or one or more active devices. One advantage that may be gained when edge pads 3*a-b* are formed coplanar with the sides of substrates 4*a-b* is that more stability may be provided because a lever affect is minimized via reduction of a distance that may be present between substrates 4*a-b* and a carrier substrate 6. Another advantage is that closer packing density may be provided.

In some embodiments, in addition to interconnections made using edge pads 3*a-b*, interconnections to substrates 4*a-b* may be made via areal flip-chip pads 9 formed thereon. In one embodiment, solder bumps 10 may be formed on one more flip-chip pads 11 of a carrier substrate 12 by standard techniques (e.g. injection molding of solder, plating, evaporation, solder paste screening). In one embodiment, two or more substrates 4*a-b* may be joined to a carrier substrate 12 via their flip-chip pads 9 and in such a way that also joins edge pads 3*a-b* of each substrate 4*a-b* together. Such an embodiment has been found useful for providing direct signal connection between substrates, and as well, power and ground connections from flip-chip connections to a carrier substrate. In one embodiment, edge pads 3*a-b* of individual substrates 4*a-b* may be joined together into a "super-chip", and then the super chip may be joined to a carrier substrate via the flip-chip pads as a whole. When forming solder bumps or other solder structures, techniques used can employee the same or different melting temperature solders to provide improved process control.

In some embodiments, connection between opposing edge pads 3*a-b* is enabled by solder or other conductive material provided from an external source. For example after positioning edge pads 3*a-b* of respective substrates 4*a-b* opposite each other, the edge pads 3*a-b* may be brought into contact with opposing solder balls 10 formed on flip chip pads 11 of a carrier substrate 12. The solder balls 10 may be reflowed to allow the surface tension and wettability of the solder balls to wick up and between opposing edge pad 3*a-b*. In some embodiments, one or more smaller flip chip pads 15 may be used, such that the surface tension of solder balls 10 may be increased to cause them to have a higher profile that better facilitates a solder wicking effect.

Referring now to FIGS. 2*a-d*, there are seen representations of embodiments of the present invention. In one embodiment, a substrate 4 is provided, for example, silicon, or other material used by those skilled in the art for processing and manufacture of integrated circuits. In FIG. 2*a*, substrate 4 is processed to comprise interconnects 2, for example, electrical circuit traces, wiring, and other active and/or non active structures that may be deposited or formed on the substrate as needed or desired. In one embodiment, interconnects 2 enable electrical coupling between one or more structures on the substrate 4.

In one embodiment, substrate 4 has formed therein one or more openings or cavities 3 formed in photoresist using standard lithographic techniques. The image formed by the photoresist may be transferred into the substrate 4 using standard micro-machining techniques, such as deep reactive ion etching (DRIE), or chemical wet etching, to a depth suitable for producing an edge bond, for example 10-100 microns, or other depths as needed. The cavities 3 are filled with a material, for example, a conductive and/or bonding material such as solder, conductive paste, epoxy, gold, copper, or the like, using standard fill techniques such as injection molding, screening, plating, etc. or others as are know to those skilled in the art. Polishing techniques may be used if needed, such as plating. Standard wiring techniques may used to make electrical connections using back end of the line interconnect processes. In one embodiment, electrical connection to the material within cavities 3 is made via a conductive trace, or other electrical structure as could be implemented by those skilled in the art. As is generally represented by the dotted rectangle 5 in FIG. 2*b*, a section of the substrate 4 may be removed to cause material within the cavities to extend beyond an edge, for example by a DRIE with undercut or xenon etching step as known to those skilled in the art. As generally represented in FIG. 2*c*, the resulting sectioned substrates 4*a-b* may be formed with vertically oriented sides such that material within one or more cavities 3 is exposed (hereafter referred to as edge pads 3*a-b*). The two sectioned substrates 4*a-b* may subsequently be coupled together via edge pads 3*a-b* by placement as shown in FIG. 2*d*. In this manner direct connections can be made between opposing edge pads 3*a-b* of opposing substrate 4*a-b*, and between other pads or other devices (not shown). Mechanical and/or electrical connection of edge pads 3*a-b* to other pads or devices may be achieved using any number of techniques known to those skilled in the art, for example, pre and/or post applied solder, glues, capacitative coupling, etc. Although in FIG. 2*d* edge pads 3*a-b* are shown to extend past the sides of respective substrates 4*a-b*, it will be understood that during removal step 2*b*, one or more edge pads 3*a-b* and vertical sides of the of the substrates 4*a-b* may, as needed, also be formed to be generally coplanar or flush with each other, for example, as may be achieved via etching, diamond blade dicing, laser dicing, or, DRIE, or other techniques known to those skilled in the art.

Referring now to FIGS. 3*a-c*, and other Figures as needed, there are seen representations of embodiments of the present invention during various formation steps. In one embodiment, a carrier substrate 6 has formed thereon or therein one or more carrier pads 7. Carrier pads 7 may be formed using bonding layer metallurgy (e.g. chromium/copper/nickel/gold), techniques practiced by the present invention, and/or other technologies know to those skilled in the art, for example standard semiconductor techniques that may form a array of pads, such as used for flip-chip bonding. One or more substrate 4*a* with edge pads 3*a* formed thereon may be attached to carrier pads 7, as represented in FIG. 3*b*. Subsequent joining of respective edge pads 3*a* and carrier pads 7 may be achieved using pre and/or post applied solder, conductive glue, etc, and other methods know to those skilled in the art. A resulting vertically stacked structure as represented by FIG. 3*c* may be formed. In one embodiment, the structure that may be thus formed by coupling of carrier pads 7 to edge pads 3*a* enables strong and low resistance electrical connections to be made.

Figure 4:
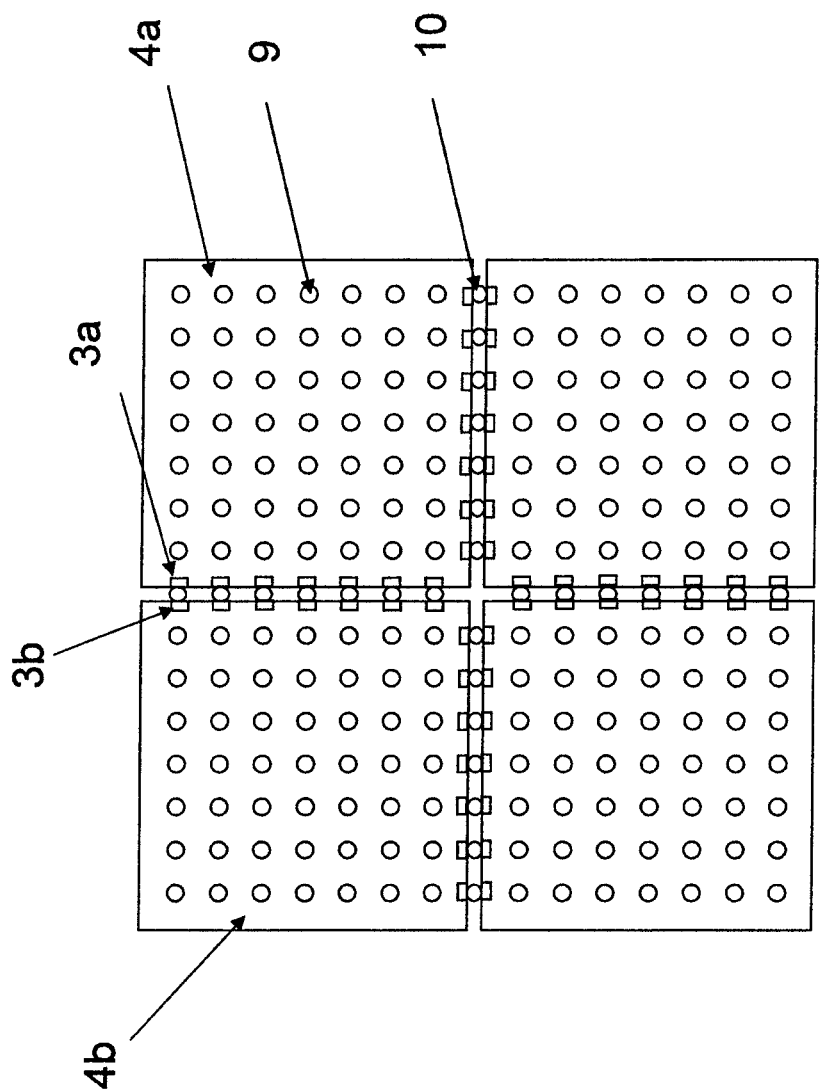
In FIG. 4 there is represented flip-chips and embodiments of the present invention.
Figure 5:
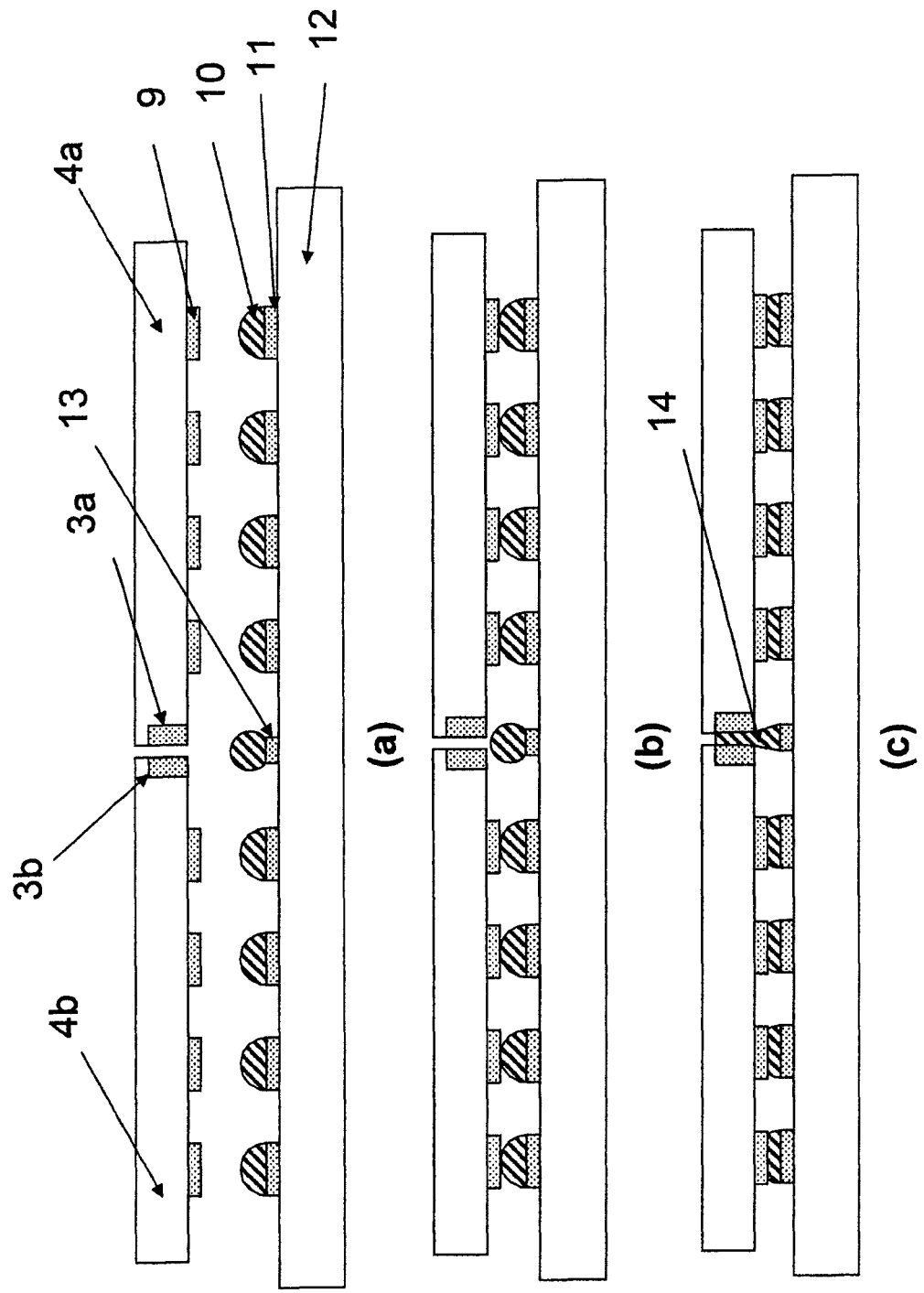
In FIGS. 5a-c there is represented flip-chips and embodiments of the present invention.
Figure 6:
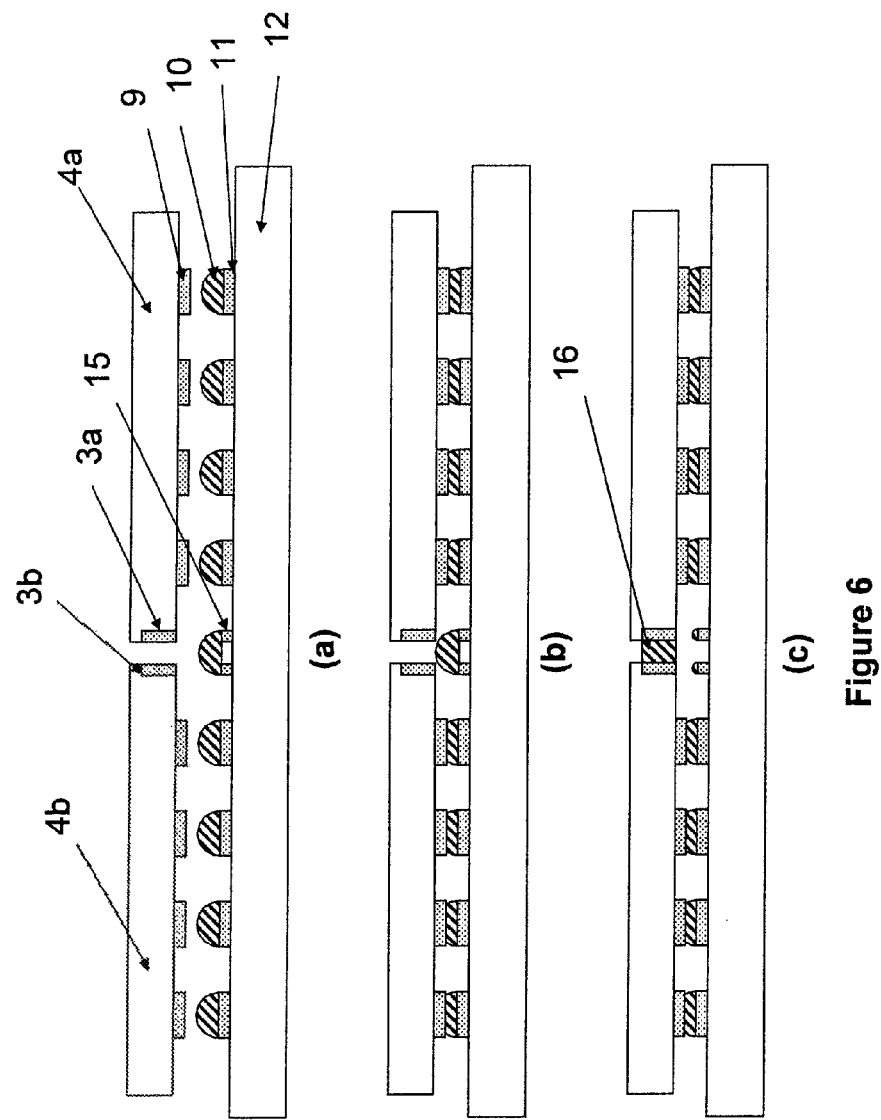
In FIGS. 6a-c there is represented flip-chips and embodiments of the present invention.
Figure 7:
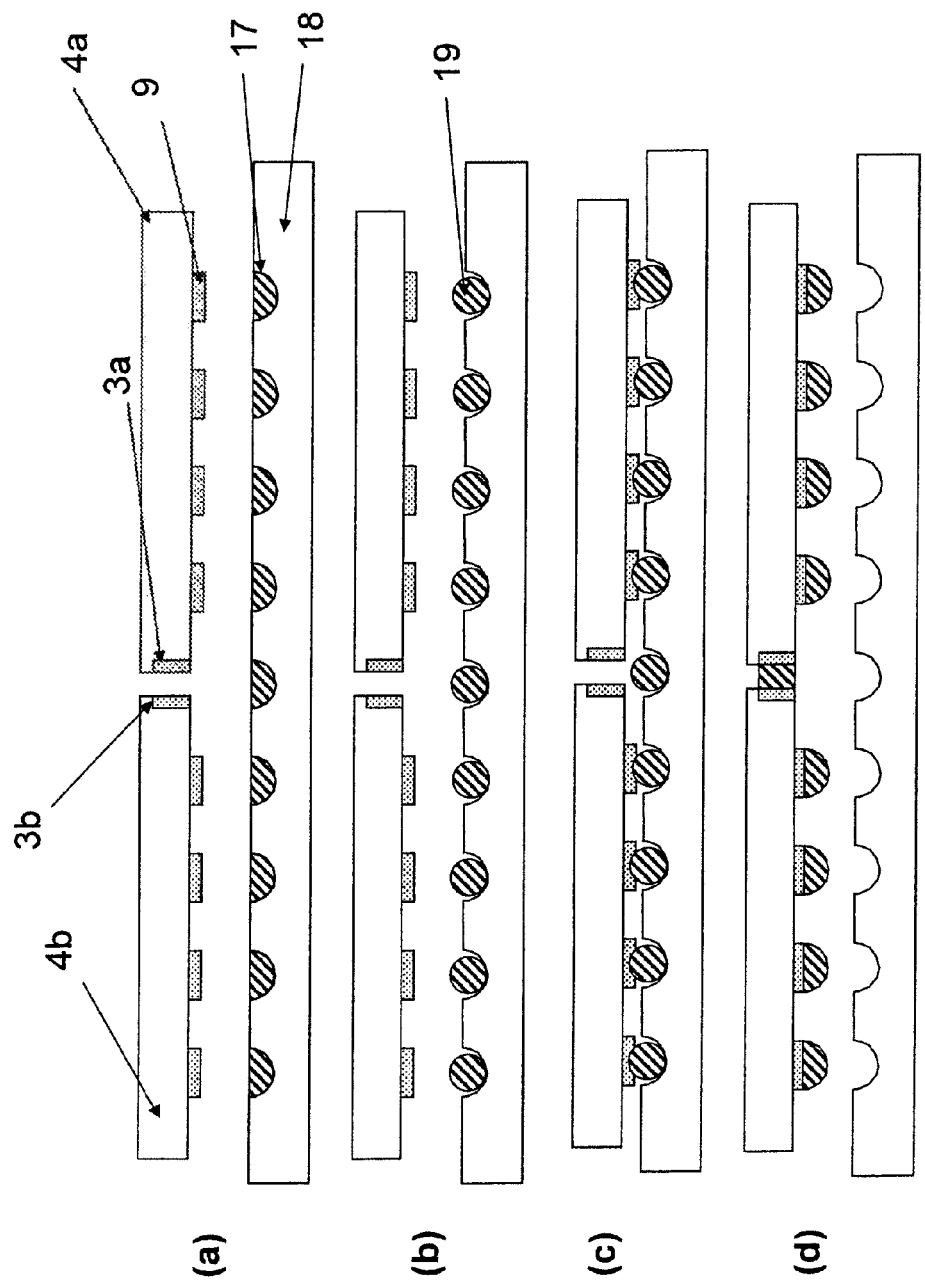
In FIGS. 7a-d there is represented the use of injection molded solder with embodiments of the present invention.
Figure 8:
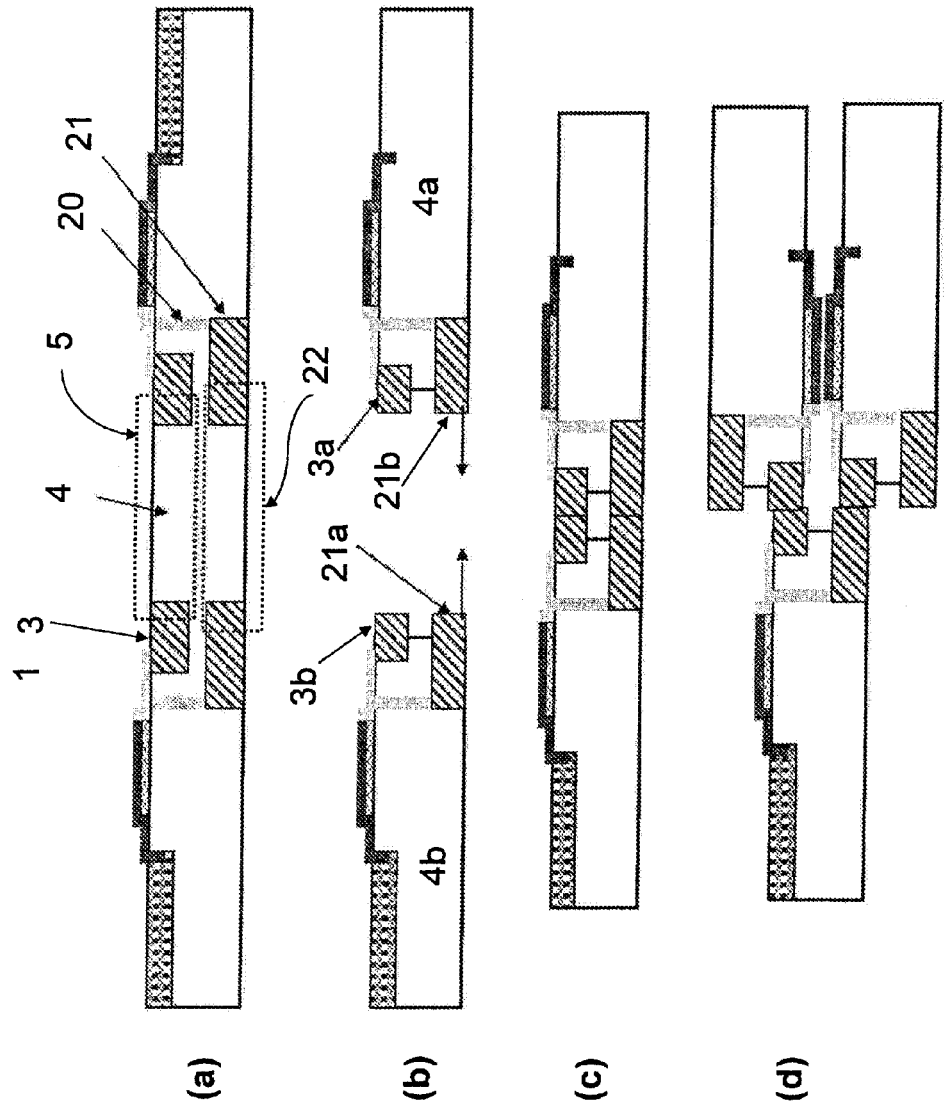
In FIGS. 8a-d there are seen representations of embodiments of the present invention.
Figure 9:
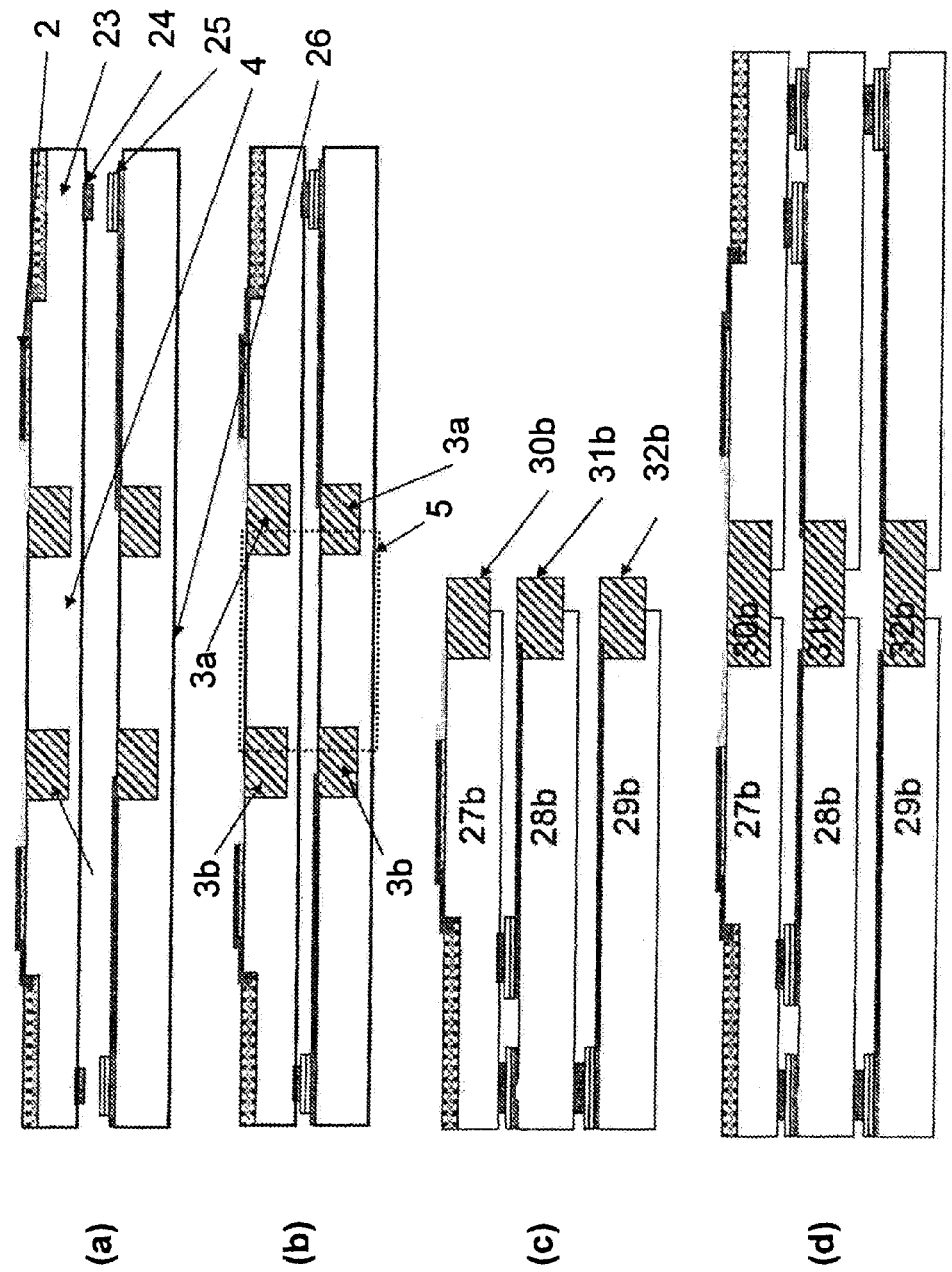
In FIGS. 9a-d there are seen representations of embodiments of the present invention.

Referring now to FIG. 4, and other Figures as needed, there is represented flip-chips and embodiments of the present invention. In one embodiment, substrates 4a-b with respective edge pads 3a-b formed therein or thereon is provided. In one embodiment, the substrates 4-ab are generally of a planar square or rectangular geometry, but in other embodiments it is understood that they may comprise other geometries. In one embodiment, top and/or bottom surface of substrates 4a-b may additionally include flip-chip type pads 9, which may be formed using techniques known to those skilled in the art. In one embodiment, individual substrates 4-ab are positioned with their respective edge pads 3a-b disposed generally opposite each other. Subsequent joining of opposing edge pads 3a-b may be achieved using pre and/or post applied solder, conductive glue, etc, or other methods and materials know to those skilled in the art.

Referring now to FIGS. 5a-c, and other Figures as needed, there is represented flip-chips and embodiments of the present invention. In one embodiment, a substrate 12, for example a carrier substrate (e.g. silicon, ceramic, organic) with or without active devices thereon, comprises a plurality of flip-chip bonding pads 11. The bonding pads 11 may be coated with solder 10 or other conductive adhesive or paste material, as is known to those skilled in the art. In embodiments, the bonding pads 11 may be coated using standard bumping techniques such as injection molding of solder, plating, evaporation, etc. The bonding pads 11 are spaced apart by a distance that generally corresponds to a distance between flip-chip pads 9 on substrates 4a-b. In one embodiment, substrate 12 also comprises one or more bonding pads 13 that has disposed thereon solder, or other conductive/adhesive material, which is subsequently used to join opposing edge pads 3a-b of opposing substrates 4a-b and respective bonding pads 13 together. In one embodiment as shown in FIG. 5b, a substrate 12 is aligned to substrates 4a-b. In one embodiment, substrate 12 is placed in opposition to substrates 4a-b, and the combination of substrates is heated to a point where the solder 10 or other material attaches (e.g. by reflow) to respective corresponding pads 9 and 3a-b, as is represented in FIG. 5c. The combination of substrate 12 and substrates 4a-b may be subsequently used as an integral structure. In one embodiment, pads 13 comprise a smaller surface area than pads 11. During joining, a smaller surface are of pads 13 (vs. pad 11) preferably allows solder bumps to be formed with a higher profile such that the solder bumps can wick up more between edge pads 3a-b during a time that the solder contact formed between pads 9 and edge pads 11 is formed.

Referring now to FIGS. 6a-c, and other Figures as needed, there is represented flip-chips and embodiments of the present invention. In one embodiment, a substrate 12 is provided with a plurality of flip-chip bonding pads 11 and pads 15. In one embodiment, one or more substrates 4a-b are disposed opposite carrier substrate 12, such that when solder balls 10 on pads 11 and 15 are aligned with pads 9 and pads 3a-b, they may be joined together (e.g. by reflow) as in FIG. 6c. In one embodiment, pads 15 comprise a smaller surface area than pads 11. In one embodiment, pads 15 comprise two concentric rings (the cross-section of which is shown in FIG. 6a-c). During joining, pads 15 exert a smaller force than pads 11, which allows solder to be pulled more easily away and in between pads 3a-b during joining of substrate 12 to substrates 4a-b.

Referring now to FIGS. 7a-d, and other Figures as needed, there is represented the use of injection molded solder with embodiments of the present invention. In one embodiment, a mold 18 with voids 17 filled with solder or other conductive/adhesive material is provided. In one embodiment, mold 18 may be formed and filled with solder using standard IMS techniques such as wet etching of solder cavities in borosilicate glass. As represented in FIG. 7a, substrates 4a-b may be aligned to mold 18, and solder in mold 18 may be reflowed to create solder balls 19, as is shown in FIG. 7b. Pads 9 and edge pads 3a-b may be subsequently brought into contact with solder balls 19. As shown in FIG. 7d, when sufficiently heated, the solder balls on voids 17 can be caused to reflow and to be transferred from the mold to between respective 3a-b and to pads 9. The resulting combination of joined substrates 4a-b can as desired or needed be aligned and connected to other dies, chips, substrates using techniques described herein, or other techniques known to those skilled in the art.

Referring now to FIGS. 8a-d, and other Figures as needed, there are seen representations of embodiments of the present invention. In embodiments where higher numbers of edge pad connections are desired, techniques and principles described herein may be extended. In FIG. 8a, a substrate 4 comprises one or more interstitial conductive vias. Vias 20 may be formed to traverse a depth of substrate 4. The vias 20 may be etched and filled with conductive material according to techniques know to those skilled in the art. In one embodiment, substrate 4 may also comprise one or more cavities 3 and 21. In one embodiment, the cavities 3 and 21 are formed on opposite surfaces of the substrate. The cavities 3 and 21 may be filled with conductive material in a single step using IMS techniques or plating techniques. At least some of the cavities 3 and/or 21 may be formed to overlap with the vias 20 such that when filled with a conductive material, the resultant edge pads 3a-b and/or 21a-b make conductive contact with the conductive material in the vias 20 (i.e. to enable electrical contact between one or more of pads 3a-b and/or 21a-b). As represented by the dotted rectangles 5 and 22, sections of substrate 4 may be subsequently removed, for example by dicing, deep RIE, wet etch, laser, or other techniques known to those skilled in the art. The substrate 4 may be diced in such as way as to expose a double linear array of respective edge pads 3a-b and 21a-b along different sides of substrates 4a-b, as represented in FIG. 8b. The resulting sectioned substrates 4a-b preferably include sides that have respective top pads 3a-b and bottom pads 21a-b exposed thereon. As shown in FIG. 8c, the two sectioned substrates 4a-b may be positioned opposite and next to each other so as to allow direct electrical connection to be made between respective edge pads 3a-b and 21a-b. In this manner, linear arrays of edge pads of one substrate can be attached to linear arrays of edge pads of another substrate (FIG. 8c), or linear arrays of edge pads of one substrate can be connected to a linear arrays of edge pads of two other substrates (FIG. 8d).

Referring now to FIGS. 9a-d, and other Figures as needed, there are seen representations of embodiments of the present invention. In one embodiment, substrates 4 and 26 comprise similar or same dimensions, although not necessarily similar or same circuitry. In one embodiment, substrates 4 and 26 have formed thereon one or more vias 23, which may be filled with conductive material to provide one or more front to back electrical connections. Substrates 4, 26 may be thinned wafers, but can in some embodiments be full thickness. In one embodiment, substrate 4 has formed thereon one or more bonding pads 24 by which electrical connection may be made to circuits or wiring 2 through via 23. In one embodiment, substrate 26 has formed thereon one or more joining pads 25 by which electrical connection can be made to circuits or wiring on the substrate 26. Joining, bonding, or laminating techniques may be used to align and join respective pads 24 to 25, and in the process form an integral structure. As represented by dotted lines in FIG. 9b, a section 5 of substrates 4 and 26 may be removed, for example by one or more of dicing, deep RIE, wet etch, laser, or other techniques to expose form to sets of structures with two rows of edge pads each. In other embodiments, the techniques discussed above may be extended to provide more rows of exposed edge connection pads. For example, as is represented in FIG. 9c, three separated and bonded or laminated substrates 27b, 28b, 29b are shown after they have been etched so as to provide three sets of respective edge pads 30b, 31b, 32b. In this manner, as shown in FIG. 9d, any number of exposed edge pads 30b, 31b, 32b may be directly joined to an opposing set of edge pads. Functional density as well as improved integrity, quality, and speed of signals may be, thus, achieved.

This document describes inventive embodiments that include apparatus and methods for shielding and protecting articles from the effects in considerable detail. This was done for illustration purposes. Neither the specific embodiments of the invention as a whole, nor those of its features, limit the general principles underlying the invention. The specific features described herein may be used in some embodiments, but not in others, without departure from the spirit and scope of the invention as set forth. Many additional modifications are intended in the foregoing disclosure, and it will be appreciated by those of ordinary skill in the art that, in some instances, some features of the invention will be employed in the absence of a corresponding use of other features. The illustrative examples therefore do not define the metes and bounds of the invention and the legal protection afforded the invention, which should be limited only by the appended claims.

What is claimed is:

1. A method of interconnecting semiconductor devices, comprising the steps of:
   positioning a first semiconductor device and a second semiconductor device in proximity to one or more solder balls in a mold, wherein each semiconductor device comprises:
      a top having a generally planar surface in a first plane;
      a bottom having a generally planar surface parallel to the first plane; and
      at least one side having a generally planar surface in a second plane orthogonal to the first plane, wherein the top and the bottom and the at least one side comprise at least three generally planar surfaces and wherein the at least one side comprises one or more edge pads; and
   reflowing the solder balls, wherein at least one of the solder balls is reflowed to electrically join together at least one of the edge pads of the first semiconductor device and at least one of the edge pads of the second semiconductor device, wherein the at least one of the solder balls is reflowed from a surface of the mold generally parallel to the first plane to a position between the at least one sides of the first and second semiconductor devices.

2. The method of claim 1, wherein the first semiconductor device and the second semiconductor device are disposed relative to each other in a generally coplanar relationship.

3. The method of claim 1, wherein at least one of the edge pads is generally coplanar with the at least one side of one of the first semiconductor device and the second semiconductor device.

4. The method of claim 1, wherein each semiconductor device further comprises one or more surface pads and wherein at least one of the solder balls transfers to one of the surface pads.

5. A semiconductor unit, comprising:
   at least two semiconductor devices, wherein each of the semiconductor devices comprises:
      a top having a generally planar surface in a first plane; and
      a bottom having a generally planar surface parallel to the first plane and comprising one or more surface pads; and
   wherein a first of the semiconductor devices comprises at least one side having a generally planar surface in a second plane orthogonal to the first plane, wherein the top and the bottom and the at least one side comprise at least three generally planar surfaces and wherein the at least one side comprises one or more edge pads;
   wherein the first semiconductor device is adjacent to a second of the semiconductor devices, wherein a first edge pad of the first semiconductor device on the at least one side is electrically joined to a first surface pad on the bottom of the second semiconductor device and wherein a first surface pad on the bottom of the first semiconductor device is electrically joined to a second surface pad on the bottom of the second semiconductor device.

6. The semiconductor unit of claim 5, wherein at least one of the edge pads is generally coplanar with the at least one side of the first semiconductor device.

* * * * *